(12) United States Patent
Jeffery et al.

(10) Patent No.: US 6,429,680 B1
(45) Date of Patent: Aug. 6, 2002

(54) PIN PROGRAMMABLE REFERENCE

(75) Inventors: Philip Alan Jeffery, Tempe; Shilpa Rao, Mesa, both of AZ (US)

(73) Assignee: Semiconductor Components Industries LLC, Phoenix, AZ (US)

(*) Notice: Subject to any disclaimer, the term of this patent is extended or adjusted under 35 U.S.C. 154(b) by 15 days.

(21) Appl. No.: 09/702,604

(22) Filed: Nov. 1, 2000

(51) Int. Cl.$^7$ .................. H03K 19/173; H03K 19/00
(52) U.S. Cl. .......................... 326/38; 326/101
(58) Field of Search ...................... 326/38, 39, 37, 326/41, 47, 101

(56) References Cited

U.S. PATENT DOCUMENTS

| | | | | |
|---|---|---|---|---|
| 5,369,318 A | * | 11/1994 | Kuroda et al. | 326/66 |
| 5,877,632 A | * | 3/1999 | Goetting et al. | 326/50 |
| 6,127,849 A | * | 10/2000 | Walker | 326/86 |
| 6,181,189 B1 | * | 1/2001 | Endo et al. | 327/333 |
| 6,184,737 B1 | * | 2/2001 | Taguchi | 327/319 |
| 6,275,946 B1 | * | 8/2001 | Meir | 713/300 |

* cited by examiner

Primary Examiner—Michael Tokar
Assistant Examiner—James H. Cho

(57) ABSTRACT

A programmable logic circuit (10) receives a single-ended input signal at a D input (12). An input gate (14) of the programmable logic circuit has a first input connected to the D input, and a second input connected to a D bar input (16). An internal reference (18,22) is programmed to receive a reference level at the D bar input via a programmable external pin (24,26). The internal reference programmed corresponds to the single-ended input signal received at the D input. The internal reference can be a $V_{BB}$ reference level connected to the D bar input providing a reference level to an ECL single-ended input signal on the D input. A CMOS single-ended input signal received at the D input requires a CMOS reference level programmed at the D bar input from the internal reference.

An internal selector (72) is also used to select at a pin (76) the corresponding internal reference.

22 Claims, 2 Drawing Sheets

PIN PROGRAMMABLE REFERENCE

BACKGROUND OF THE INVENTION

The present invention relates in general to electronic circuits and, more particularly, to logic circuits.

A typical logic circuit, i.e. latch, gate, or buffer, has an input/output (I/O) standard for differential input or a single-ended input mode of operation. The logic circuit can be a circuit from a Complementary Metal Oxide Semiconductor (CMOS), Emitter Coupled Logic (ECL), or a Positive Emitter Coupled Logic (PECL) technology. The differential input device typically has a D input pin and a D bar input pin, both of which are external pins to the logic circuit. The D bar input is the complement of the D input. The single-ended input device typically has one input, D input, which is an external pin to the logic circuit. The D bar input of the single-ended input device is connected to a voltage reference corresponding to the single-ended input signal on the D input.

The differential input device has a differential signal received on the D input pin and its complement on the D bar input pin of the logic circuit. However, single-ended input devices only require one input for the single-ended input signal and as a result are typically used over differential input devices. For example, an ECL single-ended input device has an ECL single-ended input signal at the D input and a voltage reference of $V_{BB}$ connected external to the logic circuit at the D bar input. A typical $V_{BB}$ reference level used for a single-ended input device is centered around a conventional ECL voltage swing. However, the $V_{BB}$ reference level is only used for a single-ended input device receiving a single-ended input ECL signal. Thus, a voltage reference of $V_{BB}$ on the D bar input can create problems when not receiving an ECL input signal. For example, to receive a CMOS single-ended input signal on the D input of a single-ended input device a different voltage level is required at the D bar input. The $V_{BB}$ reference level connected to the D bar input when receiving a CMOS single-ended input signal on the D input provides an incorrect voltage reference. An additional connection, or a different device manufactured for CMOS single-ended input operation is typically needed to provide the necessary reference level for a CMOS single-ended input signal.

Thus, it is desired to have a logic circuit that can receive different single-ended input signals, i.e. ECL, CMOS, or PECL using only one device to resolve the above problems. The invention disclosed herein will address the above problems.

DETAILED DESCRIPTION OF THE DRAWINGS

Figure 1:
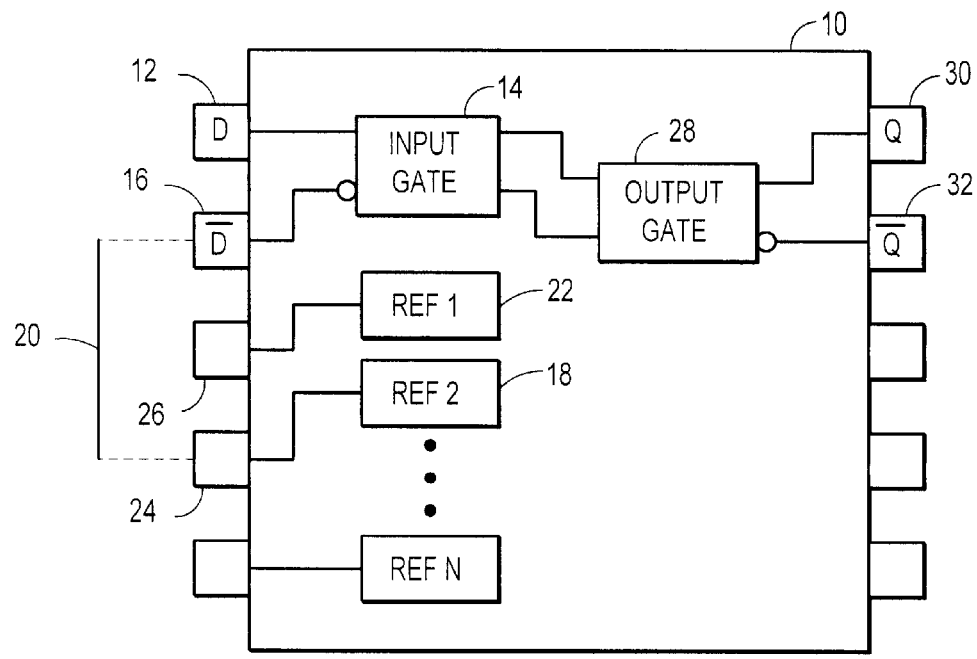
FIG. 1 is a schematic diagram of a logic circuit showing a programmable connection to various reference levels.

FIG. 1 illustrates an embodiment of programmable logic circuit 10. Programmable logic circuit 10 receives a single-ended input signal at D input 12. D input 12 is a pin of programmable logic circuit 10. The single-ended input signal can be a Complementary Metal Oxide Semiconductor (CMOS), Emitter Coupled Logic (ECL), or a Positive Emitter Coupled Logic (PECL) signal. Input gate 14 has a first input connected to D input 12 of programmable logic circuit 10. A second input from input gate 14 is connected to D bar input 16 of programmable logic circuit 10. Input gate 14 is typically a logic circuit or logic gate from a CMOS, ECL, or PECL technology. For example, input gate 14 can be a latch logic gate from an ECL technology receiving an ECL single-ended input signal on D input 12. In this case, a $V_{BB}$ reference level is connected to D bar input 16 to provide a voltage reference for the single-ended input signal on D input 12. The $V_{BB}$ reference level is a voltage level centered around the voltage swing of a typical ECL signal and allows a differential input signal device to receive an ECL single-ended input signal on D input 12. The $V_{BB}$ reference level is typically −1.3 volts referenced to the maximum voltage of the logic circuit power supply. To provide the $V_{BB}$ reference level to D bar input 16, an internal reference level to programmable logic circuit 10 is connected to D bar input 16. The internal reference level represents the $V_{BB}$ reference level required. For example, lets say the internal reference level representing a $V_{BB}$ reference level is internal reference 18 of programmable logic circuit 10. Internal reference 18 is shown as reference 2 in FIG. 1. Internal reference 18 provides the $V_{BB}$ reference level to D bar input 16 by adaptively coupling internal reference 18 to D bar input 16 via external connector 20 illustrated in FIG. 1. Internal reference 18 is connected to programmable pin 24 and external connector 20 is connected between programmable pin 24 and D bar input 16. Thus, internal reference 18, reference 2, is an internal voltage reference level representing a $V_{BB}$ reference level which is connected to programmable pin 24. The external connection of the $V_{BB}$ reference level at programmable pin 24 to D bar input 16 provides a means to program programmable logic circuit 10 to receive an ECL single-ended input signal at D input 12.

As another example, lets say input gate 14 is a CMOS latch logic gate receiving a CMOS single-ended input signal on D input 12. In this case, the CMOS reference level is connected to D bar input 16 to provide a reference level corresponding to the single-ended input signal on D input 12. A typical value for the CMOS reference level is the average of the peak to peak voltage of a CMOS single-ended input signal. To provide the CMOS reference level to D bar input 16 a reference level representing a CMOS reference level internal to programmable logic circuit 10 is connected to D bar input 16. For example, lets say the internal reference level representing a CMOS reference level is internal reference 22 of programmable logic circuit 10. Internal reference 22 is shown as reference 1 in FIG. 1. Internal reference 22 is an internal voltage reference level representing a CMOS reference level connected to programmable pin 26. Thus, to provide the CMOS reference level, internal reference 22 is adapted for coupling to D bar input 16. External connector 20 is connected between D bar input 16 and external connector 26. The external connection of the CMOS reference level at programmable pin 26 to D bar input 16 provides a means to program programmable logic circuit 10 to receive a CMOS single-ended input signal at D input 12.

As illustrated in FIG. 1, several, i.e. up to N, internal reference levels can be available to programmable pins of programmable logic circuit 10. Thus, as is appreciated to someone skilled in art, programmable logic circuit 10 can receive an ECL, CMOS, or PECL single-ended input signal at D input 12. External connector 20 is used to connect the necessary internal reference levels to D bar input 16. External connector 20 is connected between the corresponding programmable pin and D bar input 16 to provide the necessary reference level for the single-ended input signal on D input 12. It should be noted that, programmable logic circuit 10 can be programmed to receive other input signals as well and other internal references can be used. The embodiment disclosed herein is not limited to receiving only the above mentioned input signals.

Output gate 28 is connected to the output of input gate 14 as illustrated in FIG. 1. Output gate 28 provides an output signal to Q output 30 and its complement at Q bar output 32 of programmable logic circuit 10. Output gate 28 can be a typical logic circuit. For example, output gate 28 can be an output buffer circuit.

Figure 2:
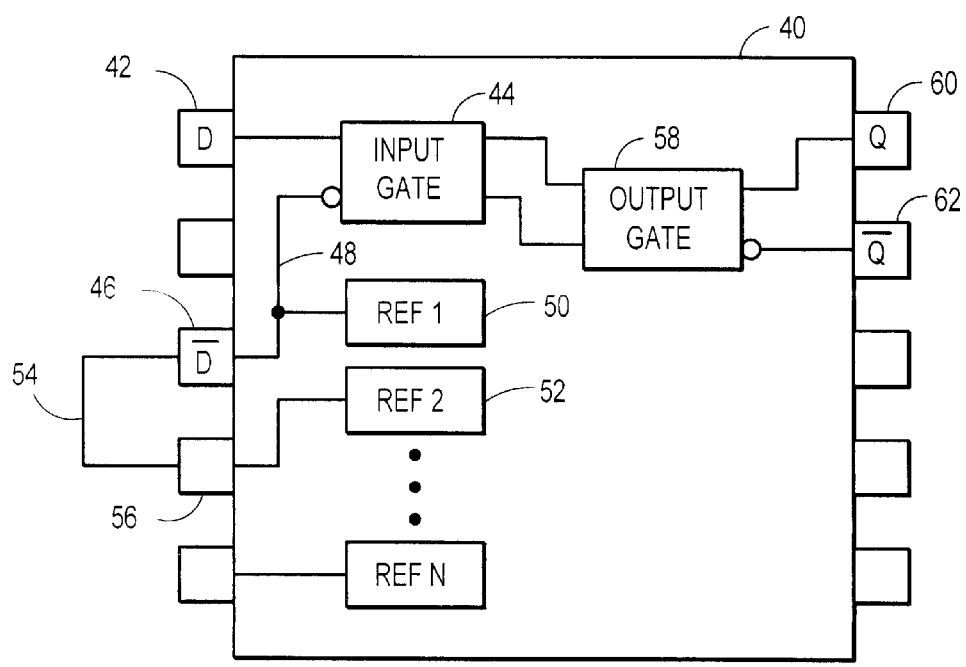
FIG. 2 is a schematic diagram of the logic circuit showing the programmable connection over-riding an internal connection to a reference level.

A second embodiment showing programmable logic circuit 40 is illustrated in FIG. 2. Programmable logic circuit 40 receives a single-ended input signal at D input 42. The single-ended input signal can be a Complementary Metal Oxide Semiconductor (CMOS), Emitter Coupled Logic (ECL), or a Positive Emitter Coupled Logic (PECL) signal. Input gate 44 has a first input connected to D input 42 of programmable logic circuit 40. A second input from input gate 44 is connected to D bar input 46 of programmable logic circuit 40. For example, input gate 44 can be an ECL latch logic gate receiving a ECL single-ended input signal on D input 42. In this case, an ECL single-ended input signal is coupled to D input 42, and a $V_{BB}$ reference level is connected to D bar input 46 to provide a voltage reference for the ECL single-ended input signal on D input 42. The $V_{BB}$ reference level is typically centered around the voltage swing of an ECL signal and allows a differential input signal device to receive a ECL single-ended input signal. The $V_{BB}$ reference level is typically −1.3 volts referenced to the maximum voltage of the logic circuit power supply. Programmable logic circuit 40 provides a fixed internally connected reference at internal reference 50. Internal reference 50 is internally connected to input gate 44 at D bar input line 48 as shown in FIG. 2. For example, fixed internal reference 50 can be a $V_{BB}$ reference level internally connected to D bar input line 48 providing a reference level to an ECL single-ended input signal on D input 42. The connection of fixed internal reference 50 to D bar input line 48 provides a fixed reference level to input gate 44 without having to pre-program programmable logic circuit 40 to receive a single-ended input signal on D input 42. Thus, no external connections are required to program programmable logic circuit 40 to receive a single-ended input signal on D input 42 corresponding to the fixed internal reference 50.

However, if fixed internal reference 50 is a $V_{BB}$ reference level and it is desired to operate programmable logic circuit 40 to receive a CMOS single-ended input signal on D input 42, an external CMOS reference level can over-ride the fixed internally connected internal reference 50. Thus, programmable pin 56 is adaptable for coupling a CMOS reference level to input gate 44 to over-ride the fixed internal reference 50. For example, if internal reference 52 is a CMOS reference level, external connector 54 is connected between programmable pin 56 and D bar input 46 to over-ride the internally connected fixed internal reference 50. Connecting external connector 54 between programmable pin 56, and D bar input 46 provides a CMOS reference level to input gate 44 at D bar input 46 providing the necessary reference level to receive the CMOS single-ended input signal on D input 42.

Output gate 58 is connected to the output of input gate 44 as illustrated in FIG. 2. Output gate 58 provides an output signal to Q output 60 and its complement at Q bar output 62 of programmable logic circuit 40. Output gate 58 can be a typical logic circuit. For example, output gate 58 can be an output buffer circuit.

Thus, fixed internal reference 50, reference 1, is an internally fixed voltage reference level which may represent a $V_{BB}$ reference level connected to D bar input line 48. Fixed internal reference 50 may be any type of fixed reference level desired, and programmable logic circuit 40 is not limited to having only an internally fixed $V_{BB}$ reference level. The external connections to programmable logic circuit 40 provides a means to over-ride internally connected fixed internal reference 50. Furthermore, up to N reference levels are available to programmable logic circuit 40 and the number is only limited to circuit design considerations.

Figure 3:
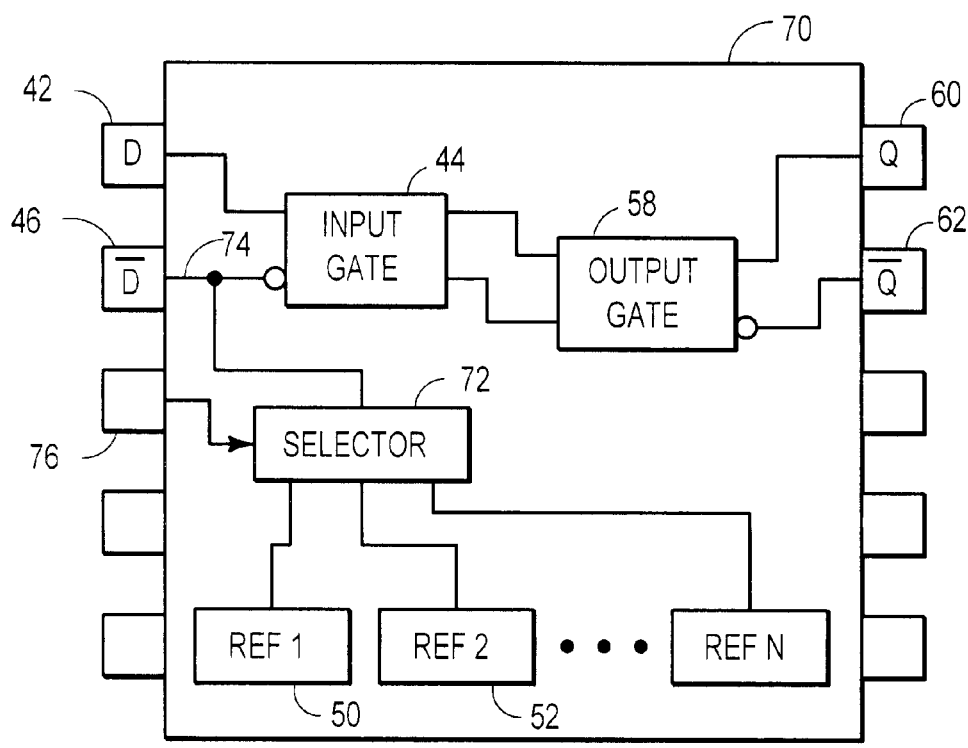
FIG. 3 is a schematic diagram of the logic circuit showing a selector connected to a plurality of internal references.

A third embodiment showing programmable logic circuit 70 is illustrated in FIG. 3. Similar figure designations are used in FIG. 3 showing similar embodiment elements to FIG. 2. Programmable logic circuit 70 receives a single-ended input signal at D input 42. The single-ended input signal can be a Complementary Metal Oxide Semiconductor (CMOS), Emitter Coupled Logic (ECL), or a Positive Emitter Coupled Logic (PECL) signal. Input gate 44 has a first input connected to D input 42 of programmable logic circuit 70. A second input from input gate 44 is connected to D bar input 46 of programmable logic circuit 70. For example, input gate 44 can be an ECL latch logic gate receiving an ECL single-ended input signal on D input 42. In this case, an ECL single-ended input signal is coupled to D input 42, and a $V_{BB}$ reference level is connected to D bar input 46 to provide a voltage reference for the ECL single-ended input signal on D input 42. The $V_{BB}$ reference level is typically centered around the voltage swing of an ECL signal. The $V_{BB}$ reference level is typically −1.3 volts referenced to the maximum voltage of the logic circuit power supply. Programmable logic circuit 70 includes internal selector 72 connected to the second input of input gate 44 at D bar input line 74. Internal selector 72 is connected to internal references 50, 52 and up to N internal references. Internal selector 72 can select one of the internal references 50, 52 by selecting at pin 76 to provide an internal reference to the second input of input gate 44 at D bar input line 74. For example, internal reference 50 can be a $V_{BB}$ reference level providing a reference level to an ECL single-ended input signal on D input 42 by selecting internal reference 50 at pin 76. The selection of internal reference 50 to D bar input line 74 provides the $V_{BB}$ reference level to the D bar input of input gate 44 to receive an ECL single-ended input signal on D input 42. Thus, no external connections are required to program programmable logic circuit 70 for the internal reference corresponding to the single-ended input signal on D input 42. However, if internal reference 50 is a $V_{BB}$ reference level and it is desired to operate programmable logic circuit 70 to receive a CMOS single-ended input signal on D input 42 a different selection of selector 72 is required. For example, if internal reference 52 is a CMOS reference level, pin 76 is re-selected to internal reference 52 to provide the necessary voltage reference at D bar input line 74 for CMOS single-ended input operation. Thus, selector 72 provides a selection of internal references 50, 52 up to N internal references by selecting at pin 76. The internal references may be any type of reference levels desired, and programmable logic circuit 70 is not limited to having only a $V_{BB}$ and CMOS reference level. Internal selector 72 can be a multiplexor or any other type of electronic selector known in the art. Further to note is that internal selector 72 is connected to D bar input line 74 which is connected between D bar input 46 and the second input to input gate 44. Thus, a signal applied to D bar input 46 can over-ride internal selector 72. The configuration can support a different reference level applied to D bar input 46 which is not part of the plurality of internal references connected to internal elector 72. Further, a differential configuration can be implemented by applying a differential signal to D input 42 and D bar input 46.

Output gate 58 is connected to the output of input gate 44 as illustrated in FIG. 3. Output gate 58 provides an output signal to Q output 60 and its complement at Q bar output 62 of programmable logic circuit 70. Output gate 58 can be a typical logic circuit. For example, output gate 58 can be an output buffer circuit.

Thus, a programmable logic circuit has been disclosed which provides internal reference levels which can be programmed externally to a logic circuit. The internal reference levels provide a reference voltage level to the single-ended input signal provided on a D bar input to the programmable logic circuit. An internally connected fixed reference level can be connected to the D bar input signal, and an over-ride of this signal is provided by external pins to the programmable logic circuit. Further, an internal selector has been disclosed which selects, by an external pin, the desired internal reference corresponding to the single-ended input signal on the D input pin of the programmable logic circuit. The logic circuit described herein provides a means to program different reference levels on a single logic circuit to receive different single-ended input signals.

What is claimed is:

1. An integrated circuit, comprising:
   a logic circuit having a first input coupled for receiving an input signal; and
   an internal reference providing a reference signal to a programmable pin, wherein the programmable pin is adaptable for coupling the reference signal to a second input of the logic circuit and wherein the internal reference is selected from a group consisting of a Complementary Metal oxide Semiconductor (CMOS), Emitter Coupled Logic (ECL), and Positive Emitter Coupled Logic (PECL) reference voltage.

2. The integrated circuit of claim 1, further including a pin coupled to the second input of the logic circuit and adaptable for coupling to the internal reference via the programmable pin.

3. The integrated circuit of claim 1, wherein the ECL reference voltage is −1.3 volts referenced from a power supply.

4. The integrated circuit of claim 1, wherein the CMOS reference voltage is the average of the maximum voltage of a CMOS single-ended input signal.

5. The integrated circuit of claim 1, wherein the first input is a D input and the second input is a D bar input to the integrated circuit.

6. The integrated circuit of claim 1, wherein the input signal is a single-ended input signal.

7. The integrated circuit of claim 1, further including an internal selector coupled to receive the internal reference and coupled to provide the reference signal to the second input of the logic circuit.

8. The integrated circuit of claim 7, wherein the internal selector is a multiplexer.

9. A logic circuit, comprising:
   a logic gate coupled for receiving a reference signal and an information signal;
   a plurality of internal references having outputs adaptable for coupling to the logic gate, whereby one of the internal references is selected to provide the reference signal based on the information signal to the logic gate; and
   a programmable pin of the logic circuit coupled to one of the plurality of internal references.

10. The logic circuit of claim 9, further including a first pin coupled to the logic gate for receiving the information signal.

11. A logic circuit, comprising:
    a logic gate coupled for receiving a reference signal and an information signal;
    a plurality of internal references having outputs adaptable for coupling to the logic gate, whereby one of the internal references is selected to provide the reference signal based on the information signal to the logic gate; and
    a second pin coupled to the logic gate for receiving the reference signal.

12. The logic circuit of claim 11, wherein the plurality of internal references is selected from a group consisting of a Complementary Metal Oxide Semiconductor (CMOS), Emitter Coupled Logic (ECL), and Positive Emitter Coupled Logic (PECL) reference voltage.

13. The logic circuit of claim 12, wherein the ECL reference voltage is −1.3 volts referenced from the maximum of a power supply.

14. The logic circuit of claim 12, wherein the CMOS reference voltage is the average of the maximum voltage of a CMOS single-ended input signal.

15. The logic circuit of claim 11, wherein the information signal is selected from a group consisting of a CMOS, ECL, and PECL single-ended input signal.

16. A method of configuring a logic circuit, comprising:
    selecting one of a plurality of internal reference signals;
    configuring the logic circuit by providing for the coupling of the selected internal reference signal to the logic circuit; and
    providing a second pin of the logic circuit coupled to receive the selected internal reference signal.

17. The method of claim 16, further providing a first pin of the logic circuit coupled to receive an input signal.

18. The method of claim 16, further providing a third pin of the logic circuit providing for the coupling to the second pin to receive the selected internal reference signal.

19. A logic circuit, comprising:
    a logic gate having a first input coupled to receive an input signal;
    a plurality of internal reference circuits providing reference signals;
    a selector coupled to receive a control signal to select and route one of the reference signals to a second input of the logic gate;
    a first pin coupled to the first input of the logic gate receiving the input signal; and
    a second pin coupled to the second input of the logic gate.

20. The logic circuit of claim 19, further including a control pin coupled to provide the control signal to the selector.

21. The logic circuit of claim 19, wherein the plurality of internal reference circuits is selected from a group consisting of a Complementary Metal Oxide Semiconductor (CMOS), Emitter Coupled Logic (ECL), and Positive Emitter Coupled Logic (PECL) reference voltage.

22. The logic circuit of claim 19, wherein the reference signal is selected from the plurality of internal reference circuits based on the input signal to the logic circuit.

* * * * *